United States Patent
McGlynn et al.

(10) Patent No.: US 8,686,282 B2
(45) Date of Patent: *Apr. 1, 2014

(54) SOLAR POWER SYSTEM FOR SPACE VEHICLES OR SATELLITES USING INVERTED METAMORPHIC MULTIJUNCTION SOLAR CELLS

(71) Applicant: Emcore Solar Power, Inc., Albuquerque, NM (US)

(72) Inventors: Daniel McGlynn, Albuquerque, NM (US); Paul R. Sharps, Albuquerque, NM (US); Arthur Cornfeld, Sandia Park, NM (US); Mark A. Stan, Albuquerque, NM (US)

(73) Assignee: Emcore Solar Power, Inc., Albuquerque, NM (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/946,574

(22) Filed: Jul. 19, 2013

(65) Prior Publication Data

US 2013/0298961 A1   Nov. 14, 2013

Related U.S. Application Data

(60) Continuation-in-part of application No. 12/417,367, filed on Apr. 2, 2009, now Pat. No. 8,513,518, which is a division of application No. 11/500,053, filed on Aug. 7, 2006, now abandoned.

(51) Int. Cl.
*H01L 31/00* (2006.01)

(52) U.S. Cl.
USPC ........... 136/255; 136/252; 136/256; 136/259; 136/262; 136/292

(58) Field of Classification Search
USPC ........ 136/252, 255, 256, 259, 246, 261, 262, 136/292
See application file for complete search history.

(56) References Cited

U.S. PATENT DOCUMENTS

| | | | |
|---|---|---|---|
| 3,565,719 | A | 2/1971 | Webb |
| 3,976,508 | A | 8/1976 | Mlavsky |
| 3,999,283 | A | 12/1976 | Dean et al. |
| 4,001,864 | A | 1/1977 | Gibbons |
| 4,192,583 | A | 3/1980 | Horton |
| 4,338,480 | A | 7/1982 | Antypas et al. |
| 4,759,803 | A | 7/1988 | Cohen |

(Continued)

FOREIGN PATENT DOCUMENTS

| | | |
|---|---|---|
| GB | 2 346 010 A | 7/2000 |
| JP | 60-160181 | 8/1985 |

(Continued)

OTHER PUBLICATIONS

Cotal et al., "Outdoor Operation of GaInP/GaAs/Ge Triple Junction Concentrator Solar Cells Up to 1000 Suns," 3rd World Conf. on Photovoltaic Energy Conversion, May 11-18, 2003; Osaka, Japan; poster 825-828.

(Continued)

*Primary Examiner* — Jonathan Johnson
*Assistant Examiner* — Lindsey Bernier

(57) ABSTRACT

A system for generating electrical power from solar radiation utilizing a thin film III-V compound multijunction semiconductor solar cell mounted on a support in a non-planar configuration is disclosed herein.

20 Claims, 6 Drawing Sheets

(56) References Cited

U.S. PATENT DOCUMENTS

| | | | |
|---|---|---|---|
| 5,009,720 | A | 4/1991 | Hokuyo et al. |
| 5,019,177 | A | 5/1991 | Wanlass |
| 5,053,083 | A | 10/1991 | Sinton |
| 5,322,572 | A | 6/1994 | Wanlass |
| 5,342,453 | A | 8/1994 | Olson |
| 5,374,317 | A | 12/1994 | Lamb et al. |
| 5,376,185 | A | 12/1994 | Wanlass |
| 5,383,976 | A | 1/1995 | Fraas et al. |
| 5,405,453 | A | 4/1995 | Ho et al. |
| 5,944,913 | A | 8/1999 | Hou et al. |
| 6,103,970 | A | 8/2000 | Kilmer et al. |
| 6,239,354 | B1 | 5/2001 | Wanlass |
| 6,252,287 | B1 | 6/2001 | Kurtz et al. |
| 6,278,054 | B1 | 8/2001 | Ho et al. |
| 6,281,426 | B1 | 8/2001 | Olson et al. |
| 6,300,557 | B1 | 10/2001 | Wanlass |
| 6,300,558 | B1 | 10/2001 | Takamoto et al. |
| 6,316,716 | B1 | 11/2001 | Hilgrath |
| 6,326,540 | B1 | 12/2001 | Kilmer et al. |
| 6,340,788 | B1 | 1/2002 | King et al. |
| 6,359,210 | B2 | 3/2002 | Ho et al. |
| 6,372,980 | B1 | 4/2002 | Freundlich |
| 6,384,317 | B1 | 5/2002 | Kerschaver et al. |
| 6,452,086 | B1 | 9/2002 | Müller |
| 6,482,672 | B1 | 11/2002 | Hoffman et al. |
| 6,600,100 | B2 | 7/2003 | Ho et al. |
| 6,660,928 | B1 | 12/2003 | Patton et al. |
| 6,680,432 | B2 | 1/2004 | Sharps et al. |
| 6,951,819 | B2 | 10/2005 | Iles et al. |
| 7,071,407 | B2 | 7/2006 | Faterni et al. |
| 8,513,518 | B2 | 8/2013 | McGlynn et al. |
| 2002/0040727 | A1 | 4/2002 | Stan et al. |
| 2002/0164834 | A1 | 11/2002 | Boutros et al. |
| 2003/0041894 | A1 | 3/2003 | Sverdrup, Jr. et al. |
| 2003/0070707 | A1 | 4/2003 | King et al. |
| 2003/0140962 | A1 | 7/2003 | Sharps et al. |
| 2003/0145884 | A1 | 8/2003 | King et al. |
| 2004/0031517 | A1 | 2/2004 | Bareis |
| 2004/0045598 | A1 | 3/2004 | Narayanan et al. |
| 2004/0149331 | A1 | 8/2004 | Sharps et al. |
| 2004/0261839 | A1 | 12/2004 | Gee et al. |
| 2005/0051205 | A1 | 3/2005 | Mook, Jr. |
| 2005/0274411 | A1 | 12/2005 | King et al. |
| 2006/0144435 | A1 | 7/2006 | Wanlass |
| 2006/0162768 | A1 | 7/2006 | Wanlass et al. |
| 2006/0231130 | A1 | 10/2006 | Sharps et al. |
| 2007/0277873 | A1 | 12/2007 | Cornfeld et al. |
| 2008/0029151 | A1 | 2/2008 | McGlynn et al. |
| 2009/0078308 | A1 | 3/2009 | Varghese et al. |
| 2009/0078309 | A1 | 3/2009 | Cornfeld et al. |
| 2009/0078310 | A1 | 3/2009 | Stan et al. |
| 2009/0078311 | A1 | 3/2009 | Stan et al. |
| 2009/0229658 | A1 | 9/2009 | Stan et al. |
| 2009/0272430 | A1 | 11/2009 | Cornfeld et al. |
| 2009/0288703 | A1 | 11/2009 | Stan et al. |
| 2009/0314348 | A1 | 12/2009 | McGlynn et al. |
| 2010/0012174 | A1 | 1/2010 | Varghese et al. |
| 2010/0012175 | A1 | 1/2010 | Varghese et al. |

FOREIGN PATENT DOCUMENTS

| | | |
|---|---|---|
| JP | 9-64397 | 3/1997 |
| WO | WO 96/18213 | 6/1996 |
| WO | WO 99/62125 | 12/1999 |
| WO | WO 02/080286 A1 | 10/2002 |
| WO | WO 2005/076960 A2 | 8/2005 |

OTHER PUBLICATIONS

Garboushian et al., "A Novel High-Concentration PV Technology for Cost Competitive Utility Bulk Power Generation," Proc 1$^{st}$ World Conf. on Photovoltaic Energy Conversion, 1994; pp. 1060-1063.

Luque and Hegedus, eds., *Handbook of Photovoltaic Science and Engineering, Sections 9.8 and 9.9 and Chapter 11*, Hoboken, NJ, 2003; 64 pgs. ISBN 1591247748. Ebook accessed through North Carolina State University Libraries. http://catalog.lib.ncsu.edu/web2/tramp2.exe/goto/A1hl1rqj.002?screen=Record.html&server=1home&item=3.

Operation of 350 KW of Amonix High Concentration PV Systems at Arizona Public Service; Proceedings of ISEC 2003; 2003 International Solar Energy Conference; Hawaii, USA; Mar. 15-18, 2003; ISEC2003-44081; pp. 1-6.

Sherif et al., "First Demonstration of Multi-Junction Receivers in a Grid-Connected Concentrator Module," Conf. Rec. 31$^{st}$ IEEE PV Spec. Conf., Jan. 3-7, 2005; pp. 635-638.

Sinharoy et al., "Progress in the Development of Metamorphic Multi-Junction III-V Space Solar Cells," *Prog. Photovolt: Res. Appl.*, 2002; 10:427-432.

Slade et al., "High Efficiency Solar Cells for Concentrator Systems: Silicon or Multi-Junction?" *SPIE Optics and Photonics*, San Diego; Aug. 2005.

Sopori, "Thin-film Silicon Solar Cells," *Handbook of Photovoltaic Science and Engineering*, edited by Antonio Luque and Steven Hegedus, Chapter 8 (8.1-8.4), pp. 307-357.

Stone et al., "Design & Performance of the Amonix High Concentration Solar PV System," ASES/ASME National Solar Energy Conf., Reno, NV, 2002.

Venkatasubramanian et al., "An Inverted Growth Approach to Development of an IR-Transparent, High-Efficiency AlGaAs/GaAs Cascade Solar Cell," pp. 93-98.

Wanlass et al., "Lattice-Mismatched Approaches for High-Performance, III-V Photovoltaic Energy Converters," Conference Proceedings of the 31$^{st}$ IEEE Photovoltaic Specialists Conference, Jan. 3-7, 2005; pp. 530-535.

SOLAR POWER SYSTEM FOR SPACE VEHICLES OR SATELLITES USING INVERTED METAMORPHIC MULTIJUNCTION SOLAR CELLS

REFERENCE TO RELATED APPLICATIONS

This application is a Continuation-in-part of application Ser. No. 12/417,367, filed Apr. 2, 2009, which is a Division of application Ser. No. 11/500,053, filed Aug. 7, 2006, both of which are herein incorporated by reference in their entireties.

This application is also related to co-pending U.S. patent application Ser. No. 11/445,793 filed Jun. 2, 2006 and assigned to the common assignee.

BACKGROUND OF THE INVENTION

1. Field of the Invention

The present invention relates generally to solar power systems for the conversion of sunlight into electrical energy, and, more particularly, to the use of III-V compound semiconductor solar cells.

2. Description of the Related Art

Commercially available silicon solar cells for terrestrial solar power application have efficiencies ranging from 8% to 15%. Compound semiconductor solar cells, based on III-V compounds, have 28% efficiency in normal operating conditions and 32.6% efficiency under concentration. Moreover, it is well known that concentrating solar energy onto the photovoltaic cell increases the cell's efficiency.

Terrestrial solar power systems currently use silicon solar cells in view of their low cost and widespread availability. Although compound semiconductor solar cells have been widely used in satellite applications, in which their power-to-weight efficiencies are more important than cost-per-watt considerations in selecting such devices, such solar cells have not yet been designed and configured for terrestrial systems, nor have terrestrial solar power systems been configured and optimized to utilize compound semiconductor solar cells.

In conventional solar cells constructed with silicon (Si) substrates, one electrical contact is typically placed on a light absorbing or front side of the solar cell and a second contact is placed on the back side of the cell. A photoactive semiconductor is disposed on a light-absorbing side of the substrate and includes one or more p-n junctions, which creates electron flow as light is absorbed within the cell.

The contact on the face of the cell where light enters is generally expanded in the form of a grid pattern over the surface of the front side and is generally composed of a good conductor such as a metal. The grid pattern does not cover the entire face of the cell since grid materials, though good electrical conductors, are generally not transparent to light.

The grid pattern on the face of the cell is generally widely spaced to allow light to enter the solar cell but not to the extent that the electrical contact layer will have difficulty collecting the current produced by the electron flow in the cell. The back electrical contact has not such diametrically opposing restrictions. The back contact simply functions as an electrical contact and thus typically covers the entire back surface of the cell. Because the back contact must be a very good electrical conductor, it is almost always made of metal layer.

The placement of both anode and cathode contacts on the back side of the cell simplifies the interconnection of individual solar cells in a horizontal array, in which the cells are electrically connected in series. Such back contact designs are known from PCT Patent Publication WO 2005/076960 A2 of Gee et al. for silicon cells, and U.S. patent application Ser. No. 11/109,016 filed Apr. 19, 2005, herein incorporated by reference, of the present assignee, for compound semiconductor solar cells.

Another aspect of terrestrial solar power system is the use of concentrators (such as lenses and mirrors) to focus the incoming sun rays onto the solar cell or solar cell array. The geometric design of such systems also requires a solar tracking mechanism, which allows the plane of the solar cell to continuously face the sun as the sun traverses the sky during the day, thereby optimizing the amount of sunlight impinging upon the cell.

Still another aspect of concentrator-based solar power cell configuration design is the design of heat dissipating structures or coolant techniques for dissipating the associated heat generated by the intense light impinging on the surface of the semiconductor body. Prior art designs, such as described in PCT International Publication No. WO 02/080286 A1, published Oct. 10, 2002, utilize a complex coolant flow path in thermal contact with the (silicon) photovoltaic cells.

Still another aspect of a solar cell system is the physical structure of the semiconductor material constituting the solar cell. Solar cells are often fabricated in vertical, multijunction structures, and disposed in horizontal arrays, with the individual solar cells connected together in an electrical series. The shape and structure of an array, as well as the number of cells it contains, are determined in part by the desired output voltage and current. One type of multijunction structure useful in the design according to the present invention is the inverted metamorphic solar cell structures, such as described in U.S. Pat. No. 6,951,819 (Iles et al.), M. W. Wanless et al, Lattice Mismatched Approaches for High Performance, III-V Photovoltaic Energy Converters (Conference Proceedings of the 31$^{st}$ IEEE Photovoltaic Specialists Conference, Jan. 3-7, 2005, IEEE Press, 2005); and U.S. Patent Application Publication No. 2007/0277873 A1 (Cornfeld et al.), and herein incorporated by reference

SUMMARY OF THE INVENTION

1. Objects of the Invention

It is an object of the present invention to provide an improved multijunction solar cell.

It is another object of the invention to provide a solar cell as a thin, flexible film that conforms to a non-planar support.

Some implementations or embodiments may achieve fewer than all of the foregoing objects.

2. Features of the Invention

Briefly, and in general terms, the invention provides a space vehicle including: a non-planar support for mounting a plurality of solar cells; and a plurality of solar cells mounted on the non-planar support, wherein each solar cell of the plurality of solar cells is capable of bending so as to conform to the non-planar surface of the non-planar support, and wherein each solar cell of the plurality of solar cells includes a thin flexible film semiconductor body formed from III-V compound semiconductors including: a first solar subcell having a first band gap; a second solar subcell disposed over the first subcell and having a second band gap smaller than the first band gap; a grading interlayer composed on InGaAlAs and disposed over the second subcell in said body and having a third band gap greater than the second band gap; and a third solar subcell over said interlayer in the body and being lattice mismatched with respect to the second subcell and having a fourth band gap smaller than the third band gap; wherein the non-planar support having the plurality of solar cells mounted thereon is attached to the space vehicle. In some embodiments, the space vehicle is a satellite.

In another aspect, the present invention provides a solar cell assembly including: a non-planar support for mounting a plurality of solar cells; and a plurality of solar cells mounted on the non-planar support, wherein each solar cell of the plurality of solar cells is capable of bending so as to conform to the non-planar surface of the non-planar support, and wherein each solar cell of the plurality of solar cells includes a thin flexible film semiconductor body formed from III-V compound semiconductors including: a first solar subcell having a first band gap; a second solar subcell disposed over the first subcell and having a second band gap smaller than the first band gap; a grading interlayer composed on InGaAlAs and disposed over the second subcell in said body and having a third band gap greater than the second band gap; and a third solar subcell over said interlayer in the body and being lattice mismatched with respect to the second subcell and having a fourth band gap smaller than the third band gap; wherein the solar cell assembly is attached to a space vehicle. In some embodiments, the non-planar support includes a curved surface.

In another aspect, the present invention provides a method for mounting a plurality of solar cells on a space vehicle, the method including: providing a non-planar support for mounting a plurality of solar cells; mounting the plurality of solar cells on the non-planar support, wherein each solar cell of the plurality of solar cells is capable of bending so as to conform to the non-planar surface of the non-planar support, and wherein each solar cell of the plurality of solar cells includes a thin flexible film semiconductor body formed from III-V compound semiconductors including: a first solar subcell having a first band gap; a second solar subcell disposed over the first subcell and having a second band gap smaller than the first band gap; a grading interlayer composed on InGaAlAs and disposed over the second subcell in said body and having a third band gap greater than the second band gap; and a third solar subcell over said interlayer in the body and being lattice mismatched with respect to the second subcell and having a fourth band gap smaller than the third band gap; and attaching the non-planar support having the plurality of solar cells mounted thereon to a space vehicle. In some embodiments, the non-planar support is adapted for attachment to a curved surface of the space vehicle.

Some implementations or embodiments of the invention may incorporate only some the of the foregoing aspects.

Figure 1:
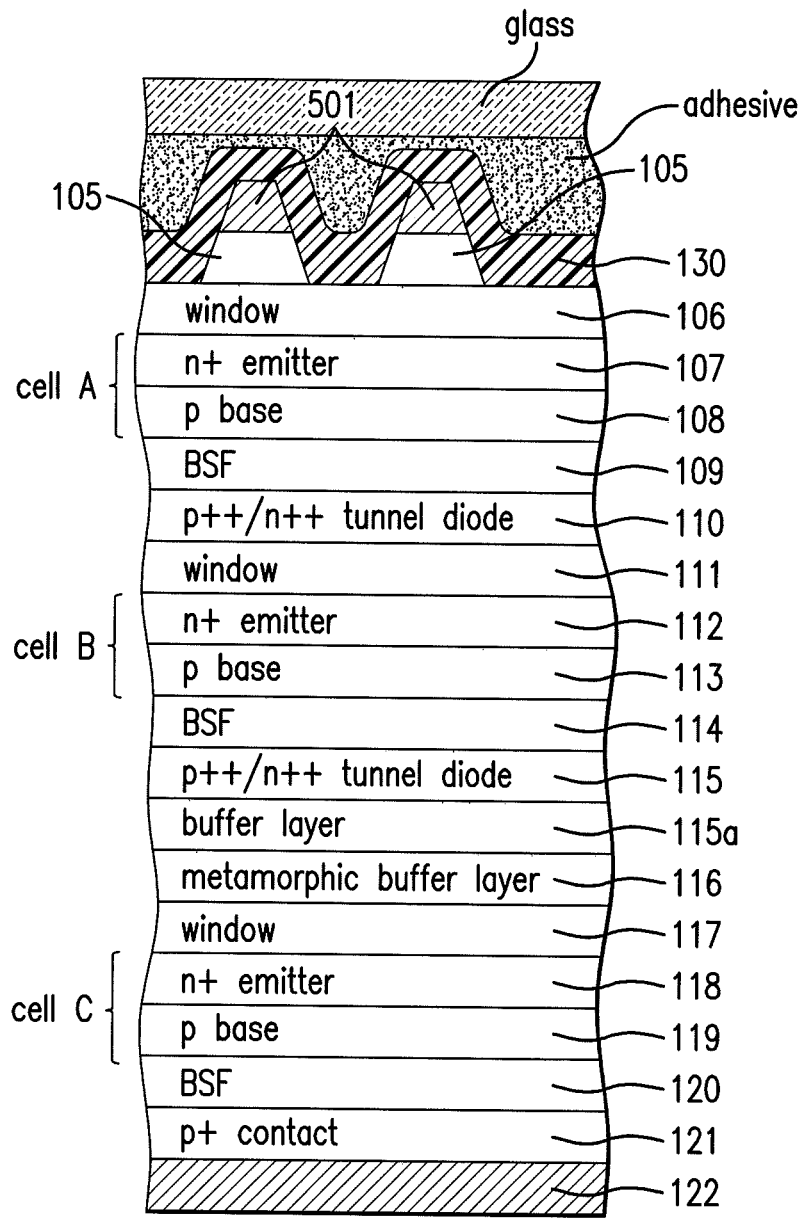
FIG. 1 shows a cross-sectional view of an inverted metamorphic solar cell that may be used in the present invention.

Additional objects, advantages, and novel features of the present invention will become apparent to those skilled in the art from this disclosure, including the following detailed description as well as by practice of the invention. While the invention is described below with reference to illustrative embodiments, it should be understood that the invention is not limited thereto. Those of ordinary skill in the art having access to the teachings herein will recognize additional applications, modifications and embodiments in other fields, which are within the scope of the invention as disclosed and claimed herein and with respect to which the invention could be of utility.

DESCRIPTION OF ILLUSTRATIVE EMBODIMENTS

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner Moreover, the drawings are not intended to depict every feature of the actual embodiment nor the relative dimensions of the depicted elements, and are not drawn to scale.

The present invention relates generally to solar power systems for the conversion of sunlight into electrical energy using III-V compound semiconductor solar cells.

FIG. 1 depicts the multijunction inverted metamorphic solar cell that may be used in one embodiment of the present invention, including three subcells A, B and C. More particularly, the solar cell is formed using the process in U.S. Patent Application Publication No. 2007/0277873 A1(Cornfeld et al.). As shown in the Figure, the top surface of the solar cell includes grid lines 501 which are directly deposited over the contact layer 105. An antireflective (ARC) dielectric layer 130 is deposited over the entire surface of the solar cell. An adhesive is deposited over the ARC layer to secure a cover glass. The solar cell structure includes a window layer 106 adjacent to the contact layer 105. The subcell A, consisting of an n+ emitter layer 107 and a p-type base layer 108, is then formed on the window layer 106.

In one embodiment, the n+ type emitter layer 107 is composed of InGA(Al)P, and the base layer 108 is composed of InGa(Al)P.

Adjacent to the base layer 108 is deposited a back surface field ("BSF") layer 109 used to reduce recombination loss. The BSF layer 109 drives minority carriers from the region near the base/BSF interface surface to minimize the effect of recombination loss.

On the BSF layer 109 is deposited a sequence of heavily doped p-type and n-type layers 110 which forms a tunnel diode, a circuit element that functions to electrically connect cell A to cell B.

On the tunnel diode layers 110 a window layer 111 is deposited. The window layer 11 used in the subcell B also operates to reduce the recombination loss. The window layer 111 also improves the passivation of the cell surface of the underlying junctions. It should be apparent to one skilled in the art, that additional layer(s) may be added or deleted in the cell structure without departing from the scope of the present invention.

On the window layer 111 of cell B are deposited: the emitter layer 112, and the p-type base layer 113. These layers in one embodiment are preferably composed of InGaP and $In_{0.015}GaAs$ respectively, although any other suitable materials consistent with lattice constant and band gap requirements may be used as well.

On cell B is deposited a BSF layer 114 which performs the same function as the BSF layer 109. A p++/n++ tunnel diode 115 is deposited over the BSF layer 114 similar to the layers 110, again forming a circuit element that functions here to electrically connect cell B to cell C. A buffer layer 115a, preferably InGaAs, is deposited over the tunnel diode 115 and has a thickness of about 1.0 micron. A metamorphic buffer layer 116 is deposited over the buffer layer 115a which is preferably a compositionally step-graded InGaAlAs series of layers with monotonically changing lattice constant to achieve a transition in lattice constant from cell B to subcell C. The bandgap of layer 116 is 1.5 ev constant with a value slightly greater than the bandgap of the middle cell B.

In one embodiment, as suggested in the Wanless et al. paper, the step grade contains nine compositionally graded steps with each step layer having a thickness of 0.25 micron. In one embodiment, the interlayer is composed of InGaAlAs, with monotonically changing lattice constant, such that the bandgap remains constant at 1.50 ev.

Over the metamorphic buffer layer 116 is a window layer 117 composed of $In_{0.78}GaP$, followed by subcell C having n+ emitter layer 118 and p-type base layer 119. These layers in one embodiment are preferably composed of $In_{0.30}GaAs$.

A BSF layer 120 is deposited over base layer 119. The BSF layer 120 performs the same function with respect to cell C as BSF layers 114 and 109.

A p+ contact layer 121 is deposited over BSF layer 120 and a metal contact layer 122, preferably a sequence of Ti/Au/Ag/Au layers is applied over layer 121.

In most general terms, the solar cell assembly is a thin film semiconductor body including a multijunction solar cell which in some embodiments have first and second electrical contacts on the back surface thereof. The module includes a support for mounting the solar cell and making electrical contact with the first and second contacts.

Figure 2:
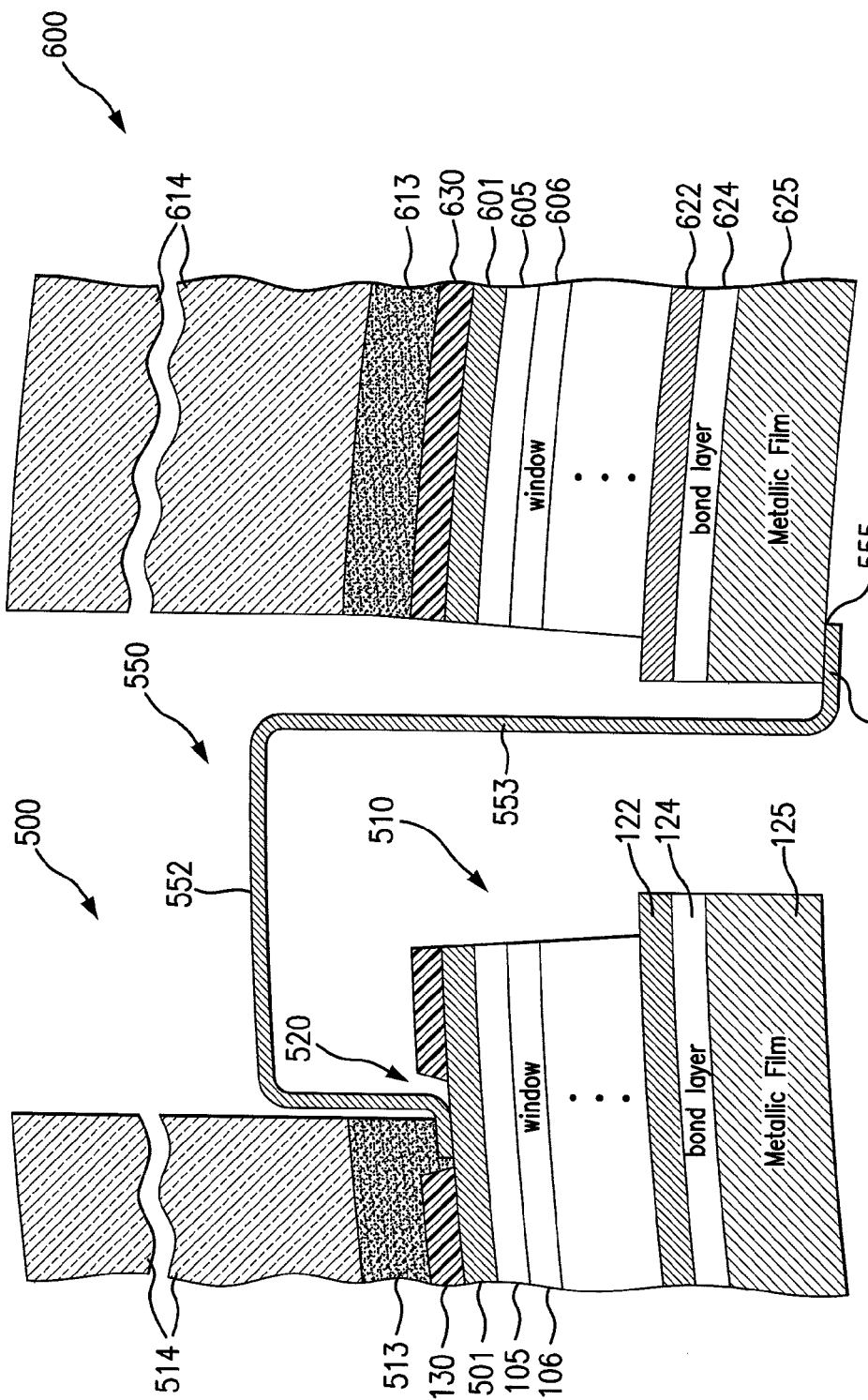
FIG. 2 is a simplified cross-sectional view of an embodiment with an electrical interconnect between solar cell 500 and solar cell 600, which are similar to the solar cell illustrated in FIG. 1, and after additional process steps.

FIG. 2 is a cross-sectional view of an embodiment with an electrical interconnect between solar cell 500 and solar cell 600, which are similar to the solar cell illustrated in FIG. 1, and after additional process steps. FIG. 2 is a simplified drawing illustrating just a few of the top layers and lower layers of the solar cell as depicted in FIG. 1. In solar cell 500, a contact pad 520 to the grid metal layer 501 is depicted proximate adhesive layer 513 and cover glass 514. Adhesive layer 613 and cover glass 614 are also illustrated in solar cell 600. Cover glasses 514 and 614 are secured to the top of solar cells 500 and 600 by adhesives 513 and 613, respectively. Cover glasses 514 and 614 are typically about 4 mils thick. Although the use of a cover glass is desirable for many environmental conditions and applications, it is not necessary for all implementations, and additional layers or structures may also be utilized for providing additional support or environmental protection to the solar cell.

Metallic films 125 and 625 are attached to metal contact layers 122 and 622 using bonding layer 124 and 624 for solar cells 500 and 600, respectively. In one embodiment of the present disclosure, bonding layers 124 and 624 are adhesives, such as polyimides (e.g., a carbon-loaded polyimide) or epoxies (e.g., a B-stage epoxy). In another embodiment of the present disclosure, bonding layers 124 and 624 are solders such as AuSn, AuGe, PbSn, or SnAgCu. The solder may be a eutectic solder.

In some embodiments, metallic films 125 and 625 are solid metallic foils. In some implementations, metallic films 125 and 625 are solid metallic foils with adjoining layers of a polyimide material, such as Kapton™. More generally, the material may be a nickel-cobalt ferrous alloy material, or a nickel iron alloy material. In some implementations, metallic films 125 and 625 comprise a molybdenum layer.

In some implementations, metallic films 125 and 625 each have a thickness of approximately 50 microns, or more generally, between 0.001 and 0.01 inches. An alternative substrate implementation would be 0.002" Kapton film plus 0.0015" adhesive/0.002" Mo Foil/0.002" Kapton film plus 0.0015" adhesive for a total thickness of 0.009". However the Kapton film can be as thin as 0.001" and as thick as 0.01". The adhesive can be as thin as 0.0005" and as thick as 0.005". The Mo foil can be as thin as 0.001" and as thick as 0.005".

FIG. 2 is an illustration of the attachment of an inter-cell electrical interconnect 550 in an embodiment of the present disclosure. The electrical interconnect 550 is generally serpentine in shape. The first end portion is typically welded to contact 520, although other bonding techniques may be used as well. The electrical interconnect 550 further includes a second U-shaped portion 552 connected to the first portion that extends over the top surface and edge 510 of the cell; a third straight portion 553 portion connected to the second portion and extending vertically parallel to the edge of the solar cell and down the side edge of the cell, and terminates in a bent contact-end-portion 554 below the bottom surface of the cell and which extends orthogonal to the third portion 553. The contact-end-portion 554 is adapted for directly connecting to the bottom contact or terminal of first polarity of adjacent second solar cell 600.

The interconnection member 550 may be composed of molybdenum, a nickel-cobalt ferrous alloy material such as Kovar™, or a nickel iron material such as Invar™ and may be substantially rectangular in shape, with a thickness of between 0.0007 and 0.0013 inches.

Figure 3:
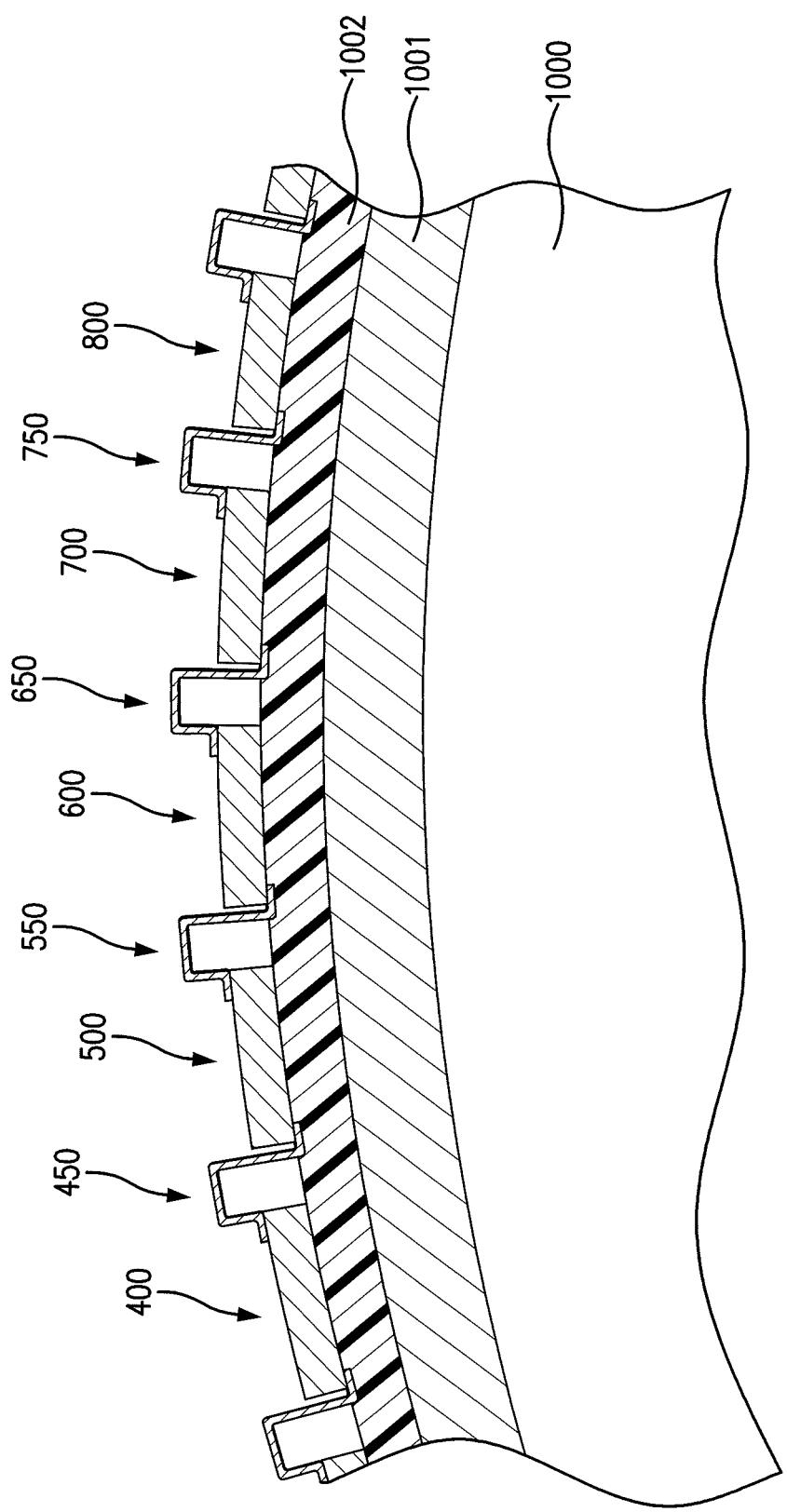
FIGS. 3 and 4 illustrates embodiments in which a solar cell assembly as illustrated in FIG. 2 is attached to a support having a non-planar surface, which in turn is attached to a space vehicle or satellite.

One aspect of the present invention depicted in FIG. 3 is that the solar cell assembly includes a plurality of flexible thin film solar cells 400, 500, 600, 700, and 800 interconnected with electrical interconnects 450, 550, 650, and 750. The solar cell assembly can be shaped so as to conform to the surface of support 1002, which has a non-planar configuration. Support 1002 can be attached to the surface of a space vehicle or satellite using adhesive 1001.

Figure 4:
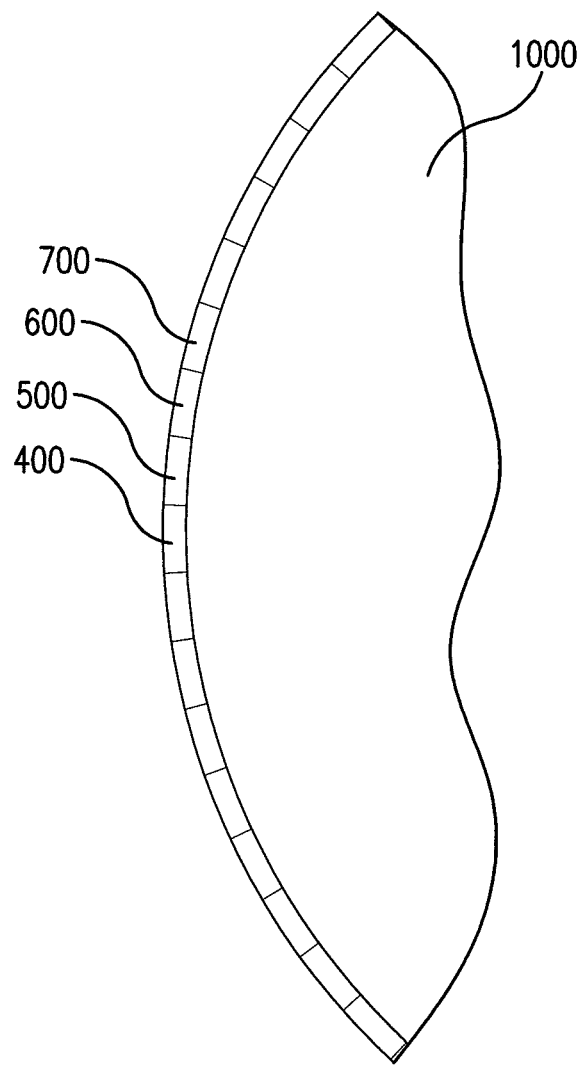

FIG. 4 is an extended view of the solar cell assembly of FIG. 3 showing that more clearly illustrates the curved surface formed by the solar cells attached to the support, which in turn is attached to the space vehicle or satellite.

Figure 5:
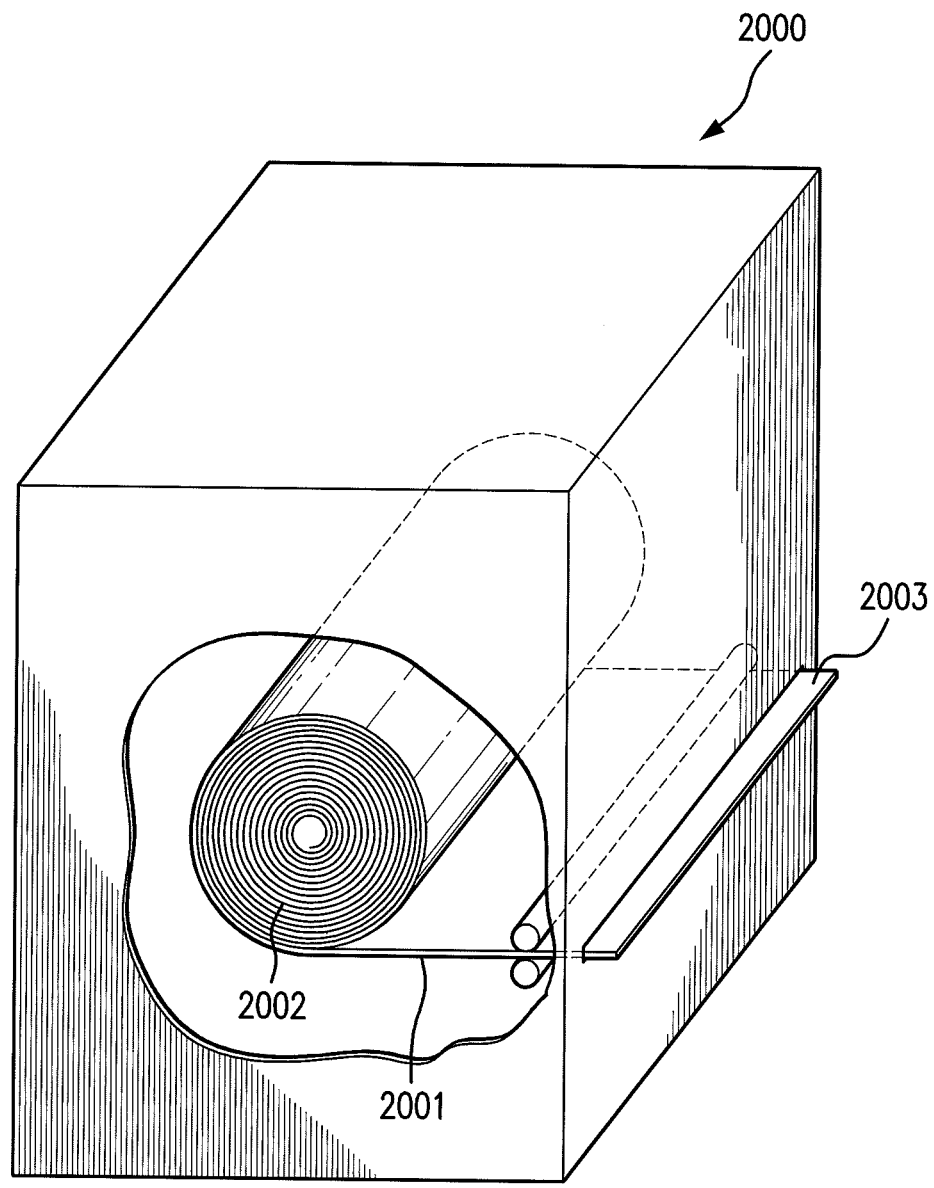
FIG. 5 is a perspective view of a solar cell array with the flexible support wound around a mandrel in a stowed position.

FIG. 5 is a perspective view of a space vehicle 2000 incorporating a solar cell array with the flexible support 2001 wound around a mandrel 2002 in a stowed position. The array/support 2001 may be an appropriate width required to meet the power panel requirements. Various standard rigid panels on existing space vehicles range in size from less than a foot on a side to more than 15 feet on a side.

Figure 6:
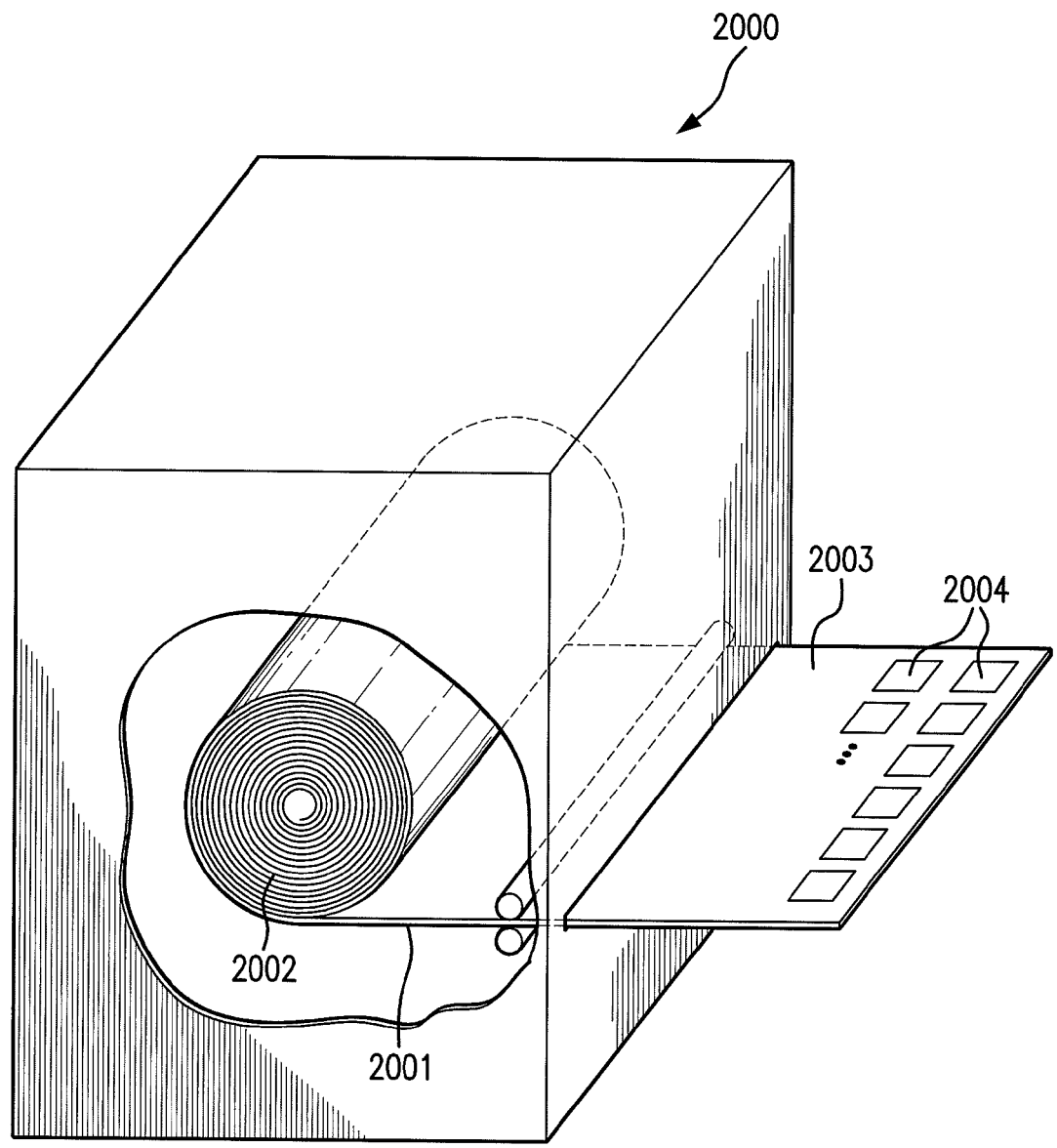
FIG. 6 is a perspective view of a space vehicle with a solar cell array with the flexible support in a deployed position.

FIG. 6 is a perspective view of a space vehicle with a solar cell array with the flexible support 2001 in a deployed position extending outward from the space vehicle 2000 so as to permit the solar cells 2004 to be illuminated by the incident sunlight.

Although this invention has been described in certain specific embodiments, many additional modifications and variations would be apparent to those skilled in the art. The present invention is therefore considered in all respects to be illustrative and not restrictive. The scope of the invention is indicated by the appended claims, and all changes that come within the meaning and range of equivalents thereof are intended to be embraced therein.

It will be understood that each of the elements described above, or two or more together, also may find a useful application in other types of constructions differing from the types described above.

While the invention has been illustrated and described as embodied in a solar power system using III-V compound semiconductors, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and therefore, such adaptations should and are intended to be comprehended within the meaning and range of equivalence of the following claims.

The invention claimed is:

1. A space vehicle and solar cell assembly comprising:
   a non-planar support for mounting a plurality of solar cells; and
   a plurality of solar cells mounted on the non-planar support, wherein each solar cell of the plurality of solar cells is shaped to conform to the non-planar surface of the non-planar support, and wherein each solar cell of the plurality of solar cells includes a thin flexible film semiconductor body formed from III-V compound semiconductors including:
   a first solar subcell having a first band gap;
   a second solar subcell disposed over the first subcell and having a second band gap smaller than the first band gap;
   a grading interlayer composed of InGaAlAs and disposed over the second subcell in said body and having a third band gap greater than the second band gap; and
   a third solar subcell over said interlayer in the body and being lattice mismatched with respect to the second subcell and having a fourth band gap smaller than the third band gap;
   wherein the non-planar support having the plurality of solar cells mounted thereon is attached to the space vehicle.

2. The space vehicle and solar cell assembly of claim 1, wherein the space vehicle is a satellite.

3. The space vehicle and solar cell assembly of claim 1, wherein the grading interlayer has a substantially constant band gap.

4. The space vehicle and solar cell assembly of claim 3, wherein the substantially constant band gap of the grading interlayer is 1.5 eV.

5. The space vehicle and solar cell assembly of claim 1, wherein the grading interlayer has a monotonically changing lattice constant.

6. The space vehicle and solar cell assembly of claim 5, wherein the grading interlayer is a compositionally step-graded InGaAlAs series of layers with a monotonically changing lattice constant.

7. The space vehicle and solar cell assembly of claim 1, wherein the first solar subcell includes an InGa(Al)P emitter region and an InGa(Al)P base region.

8. The space vehicle and solar cell assembly of claim 1, wherein the second solar subcell includes an InGaP emitter layer.

9. The space vehicle and solar cell assembly of claim 8, wherein the second solar subcell further includes an InGaAs base layer.

10. The space vehicle and solar cell assembly of claim 9, wherein the InGaAs base layer is composed of $In_{0.015}GaAs$.

11. The space vehicle and solar cell assembly of claim 1, wherein the third solar subcell includes emitter and base layers composed of InGaAs.

12. The space vehicle and solar cell assembly of claim 11, wherein the InGaAs base layer of the third solar subcell is composed of $In_{0.30}GaAs$.

13. A solar cell assembly comprising:
   a non-planar support for mounting a plurality of solar cells; and
   a plurality of solar cells mounted on the non-planar support, wherein each solar cell of the plurality of solar cells is shaped to conform to the non-planar surface of the non-planar support, and wherein each solar cell of the plurality of solar cells includes a thin flexible film semiconductor body formed from III-V compound semiconductors including:
   a first solar subcell having a first band gap;
   a second solar subcell disposed over the first subcell and having a second band gap smaller than the first band gap;
   a grading interlayer composed of InGaAlAs and disposed over the second subcell in said body and having a third band gap greater than the second band gap; and
   a third solar subcell over said interlayer in the body and being lattice mismatched with respect to the second subcell and having a fourth band gap smaller than the third band gap;
   wherein the solar cell assembly is attached to a space vehicle.

14. The solar cell assembly of claim 13, wherein the non-planar support comprises a curved surface.

15. The solar cell assembly of claim 13, wherein the space vehicle is a satellite.

16. The solar cell assembly of claim 13, wherein the grading interlayer has a substantially constant band gap of 1.5 eV.

17. The solar cell assembly of claim 13, wherein the grading interlayer is compositionally graded to lattice match the second subcell on one side and the third subcell on the opposite side.

18. A method for mounting a plurality of solar cells on a space vehicle, the method comprising:
   providing a non-planar support for mounting a plurality of solar cells;
   mounting the plurality of solar cells on the non-planar support, wherein each solar cell of the plurality of solar cells is shaped to conform to the non-planar surface of the non-planar support, and wherein each solar cell of the plurality of solar cells includes a thin flexible film semiconductor body formed from III-V compound semiconductors including:
   a first solar subcell having a first band gap;
   a second solar subcell disposed over the first subcell and having a second band gap smaller than the first band gap;
   a grading interlayer composed of InGaAlAs and disposed over the second subcell in said body and having a third band gap greater than the second band gap; and
   a third solar subcell over said interlayer in the body and being lattice mismatched with respect to the second subcell and having a fourth band gap smaller than the third band gap; and
   attaching the non-planar support having the plurality of solar cells mounted thereon to a space vehicle.

19. The method of claim 18, wherein the non-planar support is adapted for attachment to a curved surface of the space vehicle.

20. The method of claim 18, wherein the space vehicle is a satellite.

* * * * *